United States Patent
Ikeda et al.

(10) Patent No.: US 10,310,744 B2
(45) Date of Patent: *Jun. 4, 2019

(54) MEMORY SYSTEM WHICH TRANSFERS MANAGEMENT INFORMATION BETWEEN FIRST AND SECOND MEMORIES IN A BURST MODE BEFORE A READ PROCESS IS PERFORMED ON A THIRD MEMORY

(71) Applicant: Toshiba Memory Corporation, Minato-ku (JP)

(72) Inventors: Erika Ikeda, Yokohama (JP); Yoshihisa Kojima, Kawasaki (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/336,010

(22) Filed: Oct. 27, 2016

(65) Prior Publication Data
US 2017/0046076 A1 Feb. 16, 2017

Related U.S. Application Data

(62) Division of application No. 14/471,091, filed on Aug. 28, 2014, now Pat. No. 9,483,411.
(Continued)

(51) Int. Cl.
*G06F 13/00* (2006.01)
*G06F 3/06* (2006.01)
(Continued)

(52) U.S. Cl.
CPC .......... *G06F 3/0613* (2013.01); *G06F 3/0647* (2013.01); *G06F 3/0659* (2013.01);
(Continued)

(58) Field of Classification Search
CPC .... G06F 3/0613; G06F 3/0647; G06F 3/0659; G06F 3/0685; G06F 13/28;
(Continued)

(56) References Cited

U.S. PATENT DOCUMENTS 6,173,382 B1  1/2001  Dell et al.
6,772,261 B1*  8/2004  D'Antonio ............. G11C 29/48
                                                        365/63

(Continued)

FOREIGN PATENT DOCUMENTS

JP  2008-511929  4/2008
JP  2009-211225  9/2009

*Primary Examiner* — Hong C Kim
(74) *Attorney, Agent, or Firm* — Oblon, McClelland, Maier & Neustadt, L.L.P.

(57) ABSTRACT

According to one embodiment, a memory system includes a first memory, a second memory, a third memory, a data transmission controller, and a processing unit. The second memory is configured to store first management information to manage the first memory. The third memory is configured to be accessed at a speed higher than the second memory. The processing unit causes the data transmission controller to transmit second management information and third management information from the second memory to the third memory in a burst mode before a read process is performed on the first memory. The second management information and the third management information are related to the read process and are included in the first management information. The processing unit performs the read process on the first memory using the second management information and the third management information stored in the third memory.

20 Claims, 5 Drawing Sheets

Related U.S. Application Data (60) Provisional application No. 61/948,182, filed on Mar. 5, 2014.

(51) Int. Cl.
*G06F 13/16* (2006.01)
*G06F 12/1009* (2016.01)
*G06F 13/28* (2006.01)
*G11C 5/04* (2006.01)
*G11C 5/14* (2006.01)
*G06F 12/02* (2006.01)

(52) U.S. Cl.
CPC ........ *G06F 3/0685* (2013.01); *G06F 12/1009* (2013.01); *G06F 13/1668* (2013.01); *G06F 13/28* (2013.01); *G06F 12/0246* (2013.01); *G06F 2212/1024* (2013.01); *G06F 2212/2022* (2013.01); *G06F 2212/7201* (2013.01); *G11C 5/04* (2013.01); *G11C 5/143* (2013.01)

(58) Field of Classification Search
CPC ............. G06F 13/1668; G06F 12/1009; G06F 2212/1024; G06F 2212/2022; G06F 12/0246; G06F 2212/7201; G11C 5/143; G11C 5/04
USPC ........ 711/156, 154, 104, 103; 710/10.14, 22
See application file for complete search history.

(56) References Cited

U.S. PATENT DOCUMENTS

| | | | |
|---|---|---|---|
| 6,925,641 B1 | 8/2005 | Elabd | |
| 7,941,593 B2 | 5/2011 | Lee | |
| 8,041,895 B2 | 10/2011 | Kern | |
| 8,447,914 B2 | 5/2013 | Yano et al. | |
| 9,483,411 B2* | 11/2016 | Ikeda | G06F 12/1009 |
| 2003/0151939 A1 | 8/2003 | LaBerge | |
| 2006/0047892 A1* | 3/2006 | Lin | G11C 29/04 |
| | | | 711/105 |
| 2010/0030976 A1 | 2/2010 | Tashima | |
| 2014/0173268 A1 | 6/2014 | Hashimoto | |

* cited by examiner

MEMORY SYSTEM WHICH TRANSFERS MANAGEMENT INFORMATION BETWEEN FIRST AND SECOND MEMORIES IN A BURST MODE BEFORE A READ PROCESS IS PERFORMED ON A THIRD MEMORY

CROSS-REFERENCE TO RELATED APPLICATIONS

This application is a divisional of U.S. application Ser. No. 14/471,091, filed Aug. 28, 2014 and claims the benefit of priority from U.S. Provisional Application No. 61/948,182, filed on Mar. 5, 2014; the entire contents of which are incorporated herein by reference.

FIELD

Embodiments described herein relate generally to a memory system.

BACKGROUND

A solid-state drive (SSD) including a NAND flash memory (hereinafter, referred to as a NAND memory) has been known as a memory system. In the SSD, relations between a logical address and a physical page are not fixed. The logical address is designated as a reading and writing position by the host. In the SSD, a physical address space corresponding to the physical page is provided and a memory controller provided in the SSD performs the mapping between the logical address and the physical address. The mapping between the logical address and the physical address is recorded in management information and the management information is stored in the SSD.

DETAILED DESCRIPTION

In general, according to one embodiment, a memory system includes a first memory, a second memory, a third memory, a data transmission controller, and a processing unit. The second memory stores first management information to manage the first memory. The third memory is configured to be accessed at a speed higher than the second memory. The processing unit causes the data transmission controller to transmit second management information and third management information different from the second management information from the second memory to the third memory in a burst mode before a read process is performed on the first memory. The second management information and the third management information are related to the read process and are included in the first management information. The processing unit performs the read process on the first memory using the second management information and the third management information stored in the third memory.

Exemplary embodiments of a memory system will be explained below in detail with reference to the accompanying drawings. The present invention is not limited to the following embodiments.

Figure 1:
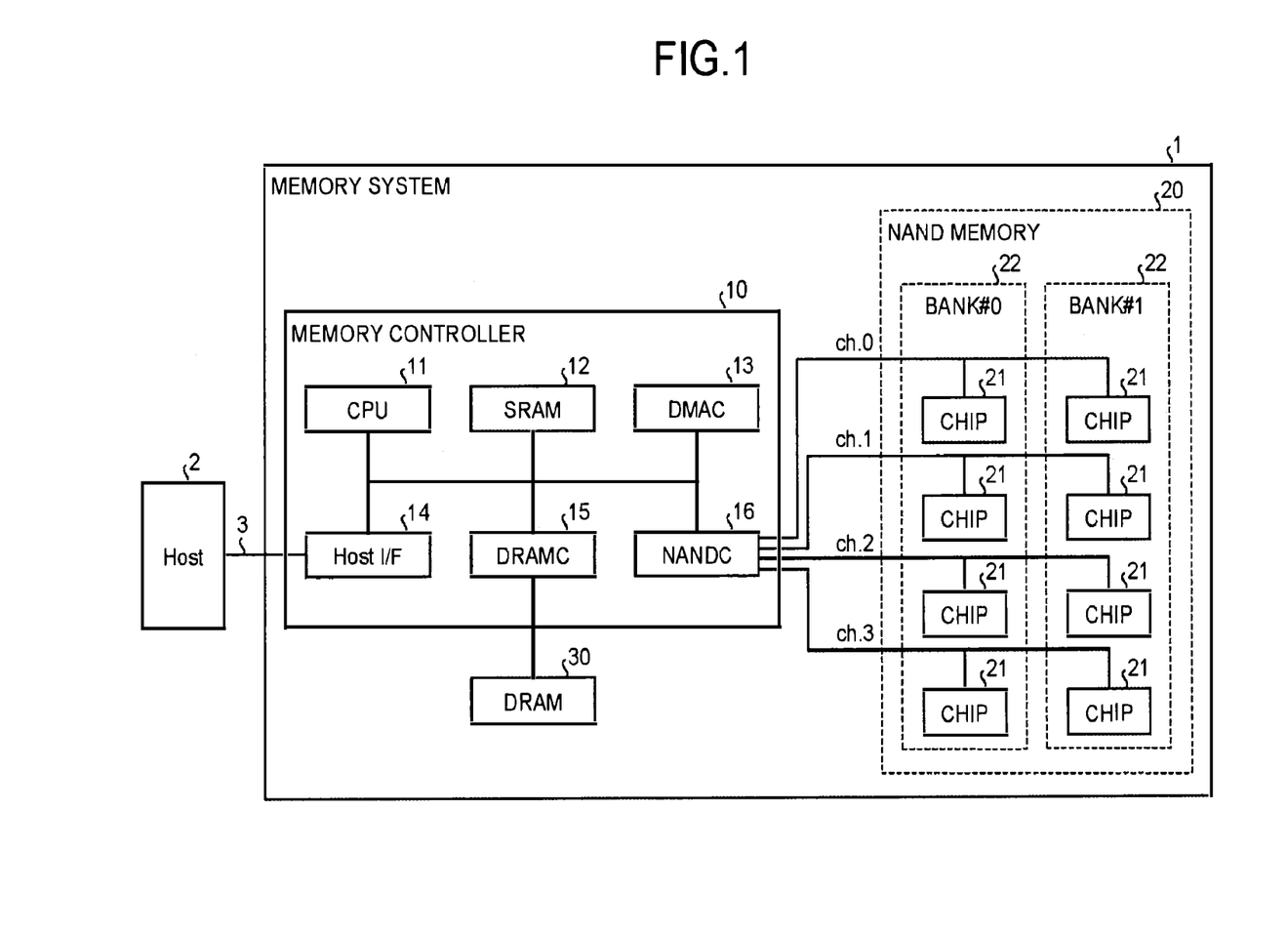
FIG. 1 is a diagram illustrating an example of the structure of a memory system according to an embodiment.

FIG. 1 is a diagram illustrating an example of the structure of a memory system according to an embodiment. A memory system 1 is connected to a host 2 through a communication path 3. The host 2, for example, is a computer. The term "computer" includes a personal computer, a portable computer, or a portable communication device. The memory system 1 functions as an external storage device of the host 2. The communication path 3 is based on any interface standard. The host 2 can issue a write command and a read command to the memory system 1. The write command and the read command are each configured to include logical address information (a first logical address) to designate an access destination.

The memory system 1 includes a memory controller 10, a NAND flash memory (NAND memory) 20 which is used as storage, and a dynamic random access memory (DRAM) 30. Further, the type of memory used as the storage is not limited only to the NAND flash memory. For example, a NOR flash memory, a resistance random access memory (ReRAM), a magnetoresistive random access memory (MRAM), or the like can be employed.

The NAND memory 20 is configured to include one or more memory chips (CHIP) 21. Herein, the NAND memory 20 includes eight memory chips 21.

Figure 2:
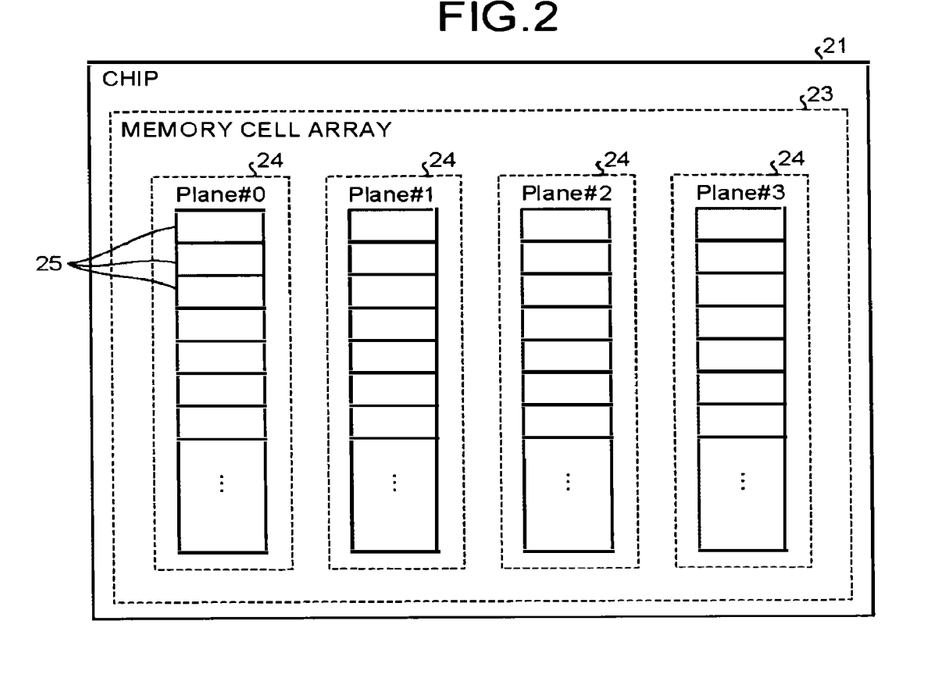
FIG. 2 is a diagram illustrating an example of the structure of each memory chip.

FIG. 2 is a diagram illustrating an example of the structure of each memory chip 21. Each memory chip 21 includes a memory cell array 23. The memory cell array 23 is configured to include a plurality of memory cells arranged in a matrix. The memory cell array 23 is divided into four districts 24. Each district 24 includes a plurality of physical blocks 25. Each district 24 individually includes peripheral circuits (for example, a row decoder, a column decoder, a page buffer, a data cache, and the like), so that the plurality of districts 24 can simultaneously perform erase/write/read operations. Each of four districts 24 in each memory chip 21 is specified using plane numbers (Plane #0 to Plane #3).

Figure 3:
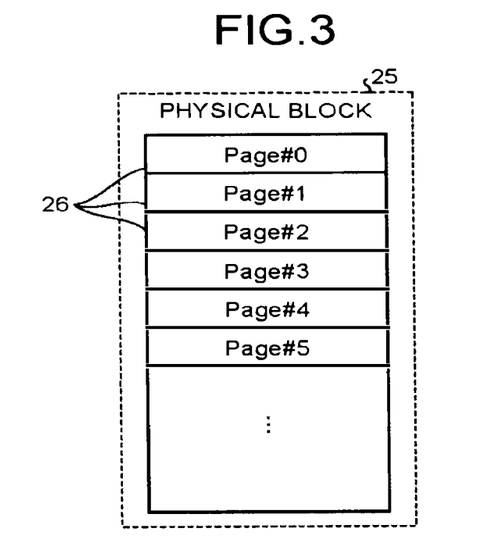
FIG. 3 is a diagram illustrating an example of the structure of each physical block.

The physical block 25 is a unit of erasing in each district 24. FIG. 3 is a diagram illustrating an example of the structure of each physical block 25. Each physical block 25 is configured to include a plurality of physical pages. A physical page 26 is a unit of writing and reading in each district 24. Each physical page 26 is identified using a page number.

Each of eight memory chips 21 included in the NAND memory 20 is connected to the memory controller 10 through one of four channels (ch.0 to ch.3). Herein, two memory chips 21 are connected to each channel. Each memory chip 21 is connected to only one of four channels. Each channel is configured by a line group which includes an I/O signal line and a control signal line. The I/O signal line is a signal line to transmit and receive data, addresses, and commands. Further, the bit width of the I/O signal line is not limited to 1 bit. The control signal line is a signal line to transmit and receive a write enable (WE) signal, a read enable (RE) signal, a command latch enable (CLE) signal, an address latch enable (ALE) signal, a write protect (WP) signal, and the like. The memory controller 10 can separately control the respective channels. The memory controller 10 can simultaneously operate four memory chips 21, each of which is connected to a different channel, by simultaneously and separately controlling four channels.

In addition, eight memory chips 21 form a plurality of banks 22 which can operate bank interleaving operation. The bank interleaving operation is one of the parallel operation techniques. Specifically, the bank interleaving operation is a technique of reducing a total transmission time between the NAND memory 20 and the memory controller 10 by issuing, while one or more memory chips 21 belonging to one bank 22 are accessing data, access request from the memory controller 10 to another bank. Herein, two banks 22 are distinguished as Bank #0 and Bank #1. More specifically, one of two memory chips 21 connected to each channel belongs to Bank #0, and the other one of the two memory chips 21 belongs to Bank #1.

In this way, the memory controller 10 simultaneously operates four channels and two banks in the bank interleaving mode, and thereby the memory controller 10 can operate eight memory chips 21 in total in parallel. In addition, the memory controller 10 simultaneously accesses four districts 24 for each memory chip 21. Herein, the memory controller 10 manages the plurality of physical blocks 25 as one logical block by combining the physical blocks, which are accessible in parallel, in one bundle. For example, the plurality of physical blocks 25 belonging to the logical block are collectively erased.

Figure 4:
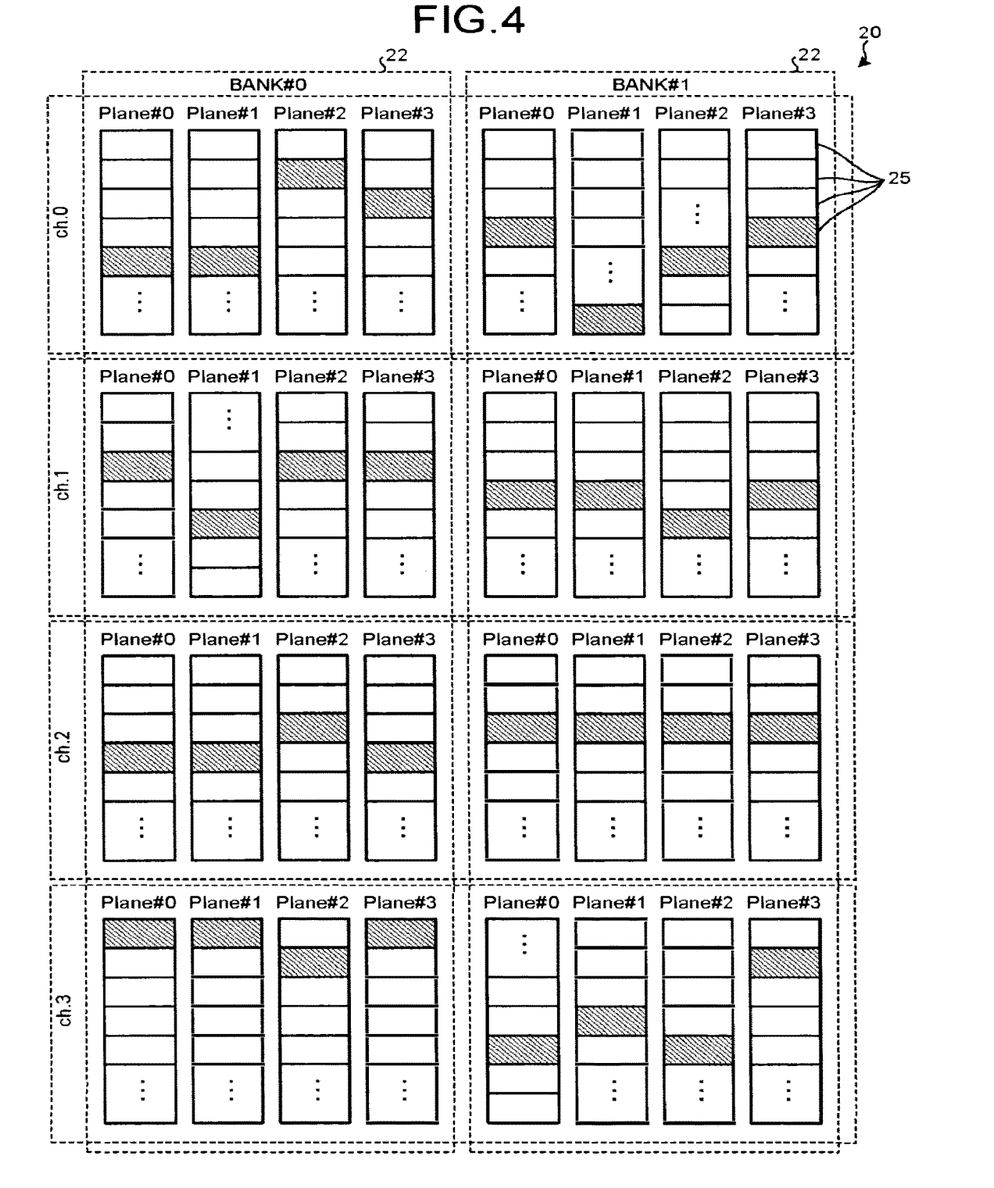
FIG. 4 is a diagram illustrating an example of the structure of each logical block.

FIG. 4 is a diagram illustrating an example of the structure of each logical block. The plurality of physical blocks 25 shaded in FIG. 4 belong to one logical block. Specifically, one physical block 25 is assigned in each district 24 up to all districts 24, all banks, and all channels, so that all these assigned physical blocks are managed as one logical block. That is, in this case, one logical block includes 32 physical blocks 25. As illustrated in FIG. 4, physical positions of the respective physical blocks 25 belonging to one logical block may be different in the respective districts 24.

A DRAM 30 stores management information (management information 31) which is used by the memory controller 10 to access the NAND memory 20. The details of the management information 31 will be described below. In addition, the DRAM 30 is used by the memory controller 10 as a buffer for data transmission between the host 2 and the NAND memory 20.

The memory controller 10 includes a central processing unit (CPU) 11, a static random access memory (SRAM) 12, a direct memory access controller (DMAC) 13, a host interface (host I/F) 14, a DRAM controller (DRAMC) 15, and a NAND controller (NANDC) 16. The CPU 11, the SRAM 12, the DMAC 13, the host I/F 14, the DRAMC 15, and the NANDC 16 are connected to one another through a bus.

The host I/F 14 performs a control on the communication path 3. Further, the host I/F 14 receives a command from the host 2. In addition, the host I/F 14 performs data transmission between the host 2 and the DRAM 30.

The DMAC 13 is a controller for making the memory controller 10 access the DRAM 30.

The CPU 11 executes a firmware program to perform the overall control of the controller 10. The NANDC 16 transmits the command received from the CPU 11 to the NAND memory 20. In addition, the NANDC 16 performs data transmission between the DRAM 30 and the NAND memory 20.

The SRAM 12 functions as a buffer for the management information 31 which is stored in the DRAM 30. The DMAC 13 transmits a part of the management information 31 from the DRAM 30 to the SRAM 12.

Figure 5:
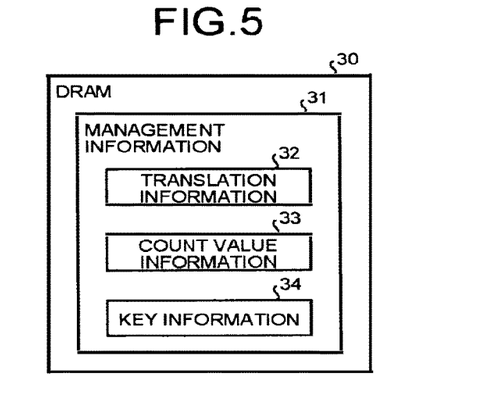
FIG. 5 is a diagram for describing management information.

FIG. 5 is a diagram for describing the management information 31 which is stored in the DRAM 30. The management information 31 includes translation information 32, count value information 33, and key information 34.

The translation information 32 is information for translating a combination of a channel number, a bank number, and an address indicating the logical block into four physical block addresses indicating the physical block 25 of each district 24 in each memory chip 21. The count value information 33 is a value counted for each block, which is obtained by integrating the number of reading operations after data is written.

When the data written in the memory cell array 23 is read by a predetermined number of times, the CPU 11 refreshes the data in order to prevent disappearance of the data due to read disturb. The count value information 33 is a parameter which is used by the CPU 11 to determine whether the data is to be refreshed.

In addition, when writing data in the NAND memory 20, the CPU 11 performs a randomization process of the writing data. The randomization process is a type of invertible data conversion, and is performed using a key which is a seed for data conversion. The key information 34 is information which indicates a key for the randomization process.

Further, it is assumed that common count value information 33 and common key information 34 are used for the four physical blocks 25 which belong to the same logical block in each memory chip 21.

Figure 6:
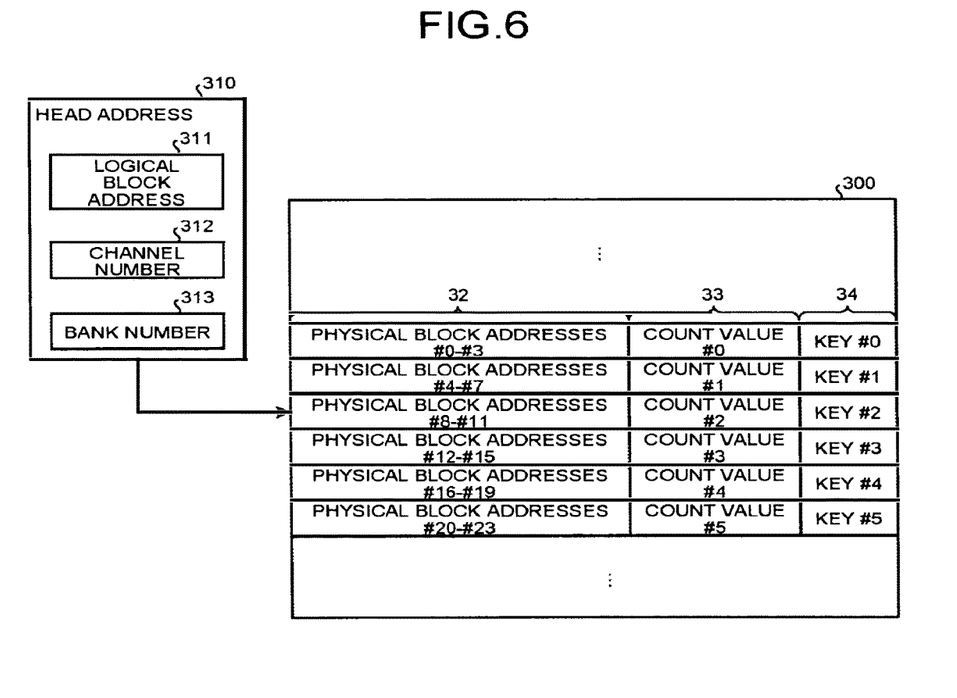
FIG. 6 is a diagram for describing a storage position of the management information in a DRAM.

FIG. 6 is a diagram for describing a storage position of the management information 31 in the DRAM 30. In the drawing, the rectangular box denoted by reference numeral 300 illustrates an address space of the DRAM 30 when it is viewed from the CPU 11. Addresses specifying positions in the DRAM 30 (hereinafter, DRAM addresses) are arranged and assigned in an ascending order from the left end to the right end of an address space 300. Then, the next DRAM address consecutive the DRAM address assigned at the right end of the address space 300 is assigned at the left end position in the next row (that is, the row below one step).

The translation information 32, the count value information 33, and the key information 34 are each divided into a plurality of data which is a unit obtained in one read process on the NAND memory 20. That is, a piece of the translation information 32, a piece of the count value information 33, and a piece of the key information 34 are combined into one and stored in a unit area of which the DRAM addresses are consecutive in order to extract necessary information among the translation information 32, the count value information 33, and the key information 34 by one read operation on the DRAM 30 when the read process is performed on the NAND memory 20. Herein, among 32 physical blocks 25 belonging to one logical block specified by a logical block address, four physical block addresses indicating four physical blocks 25 included in one memory chip 21 specified by the channel number and the bank number, and the count value information 33 and the key information 34 of the four physical blocks 25 are combined into one, and stored in an area illustrated by one row in the address space 300.

The CPU 11 sets head address information 310 and the size of one row in the address space 300 to the DMAC 13, and then activates the DMAC 13. The head address information 310 includes a logical block address 311, a channel number 312, and a bank number 313. The head address information 310 indicates a head position of any row on the address space 300. When being activated, the DMAC 13 reads data (that is, a row of information group) stored within the range that the set size shows from the position that the set head address information 310 shows in the DRAM 30, and stores the read information group in the SRAM 12. In other words, the DMAC 13 transmits the data of one row to the SRAM 12 in a burst mode. The burst mode is a scheme of accessing (reading or writing) all the data stored in an area where the head position is designated by the set address and where addresses are consecutive. Further, besides the burst mode, there is a data transmission mode (a single word mode) in which data is transmitted one by one in units of words. For example, in a case where the size of one row on the address space 300 is a size of four words (in which one word, for example, is equal to 32 bits), when the data transmission is performed in the single word mode, the access is necessarily repeated four times. On the contrary, according to the burst mode, it is possible to transmit the data of one row only by one access. The CPU 11 can appropriately read information out of the information group stored in the SRAM 12 for use.

Further, a correspondence relation between the head address information 310 and each of the logical block address 311, the channel number 312, and the bank number 313 is determined depending on the order of arranging a combination of the piece of the translation information 32, the piece of the count value information 33, and the piece of the key information 34 in the address space 300. For example, the head address information 310 of the address space 300 is configured to include the logical block address 311, the channel number 312, and the bank number 313, in which the logical block address 311 is assigned to upper digits, the channel number 312 is assigned to middle digits next to the upper digits, and the bank number 313 is assigned to lower digits next to the middle digits.

In addition, the CPU 11 can perform the read process on the NAND memory 20 in units of clusters smaller than the physical page 26. More specifically, each memory chip 21 reads data in units of pages from the memory cell array 23 to the buffer (not illustrated) in the memory chip 21 itself. The CPU 11 can acquire the data, which is read out to the buffer in units of pages, in units of clusters. Further, the cluster may be configured in a fixed or variable size.

Figure 7:
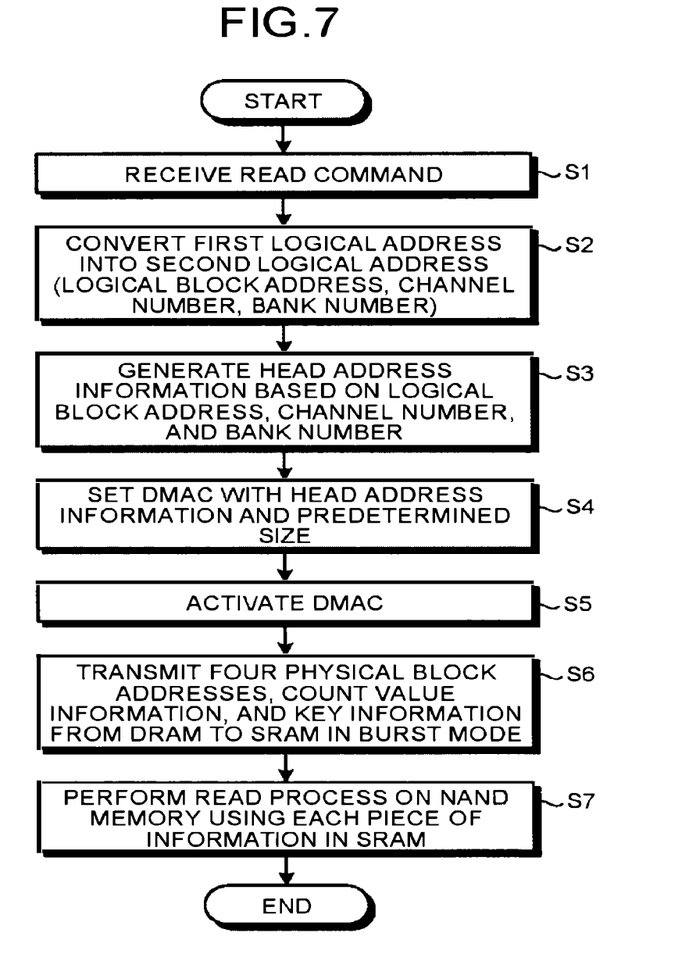
FIG. 7 is a flowchart for describing an operation of the memory system according to the embodiment.

FIG. 7 is a flowchart for describing the operation of the memory system 1 according to the embodiment. Herein, the read process on the NAND memory 20 will be described. When the host I/F 14 receives a read command from the host 2 (S1), the CPU 11 converts the first logical address included in the read command into a second logical address including at least the logical block address, the channel number, and the bank number (S2). Further, the conversion method in S2 is arbitrary. For example, the CPU 11 may store a table in which the correspondence relation between the first logical address and the second logical address is recorded in any storage area in the memory system 1, and perform the conversion using the table. In addition, the CPU 11 may perform the conversion based on a predetermined conversion formula.

Further, the read command herein will be described as a command of requesting for reading one cluster data. In a case where the read command is a command of requesting for reading data of a plurality of clusters, S2 and the subsequent processes will be performed for each of the plurality of clusters, for example.

After the process of S2, the CPU 11 generates the head address information 310 based on the logical block address, the channel number, and the bank number obtained by the conversion (S3). The CPU 11 sets the DMAC 13 with the generated head address information 310 and the size of one row on the address space 300 (S4). Then, the CPU 11 activates the DMAC 13 (S5).

The DMAC 13 reads out one row of information group stored at a position in the DRAM 30 indicated by the set head address information 310 in the burst mode, and stores the read-out information group in the SRAM 12 (S6).

The CPU 11 reads necessary information out of the information group stored in the SRAM 12, and performs the read process on the NAND memory 20 using the read-out data (S7).

The information group stored in the SRAM 12 includes four physical block addresses specifying four physical blocks, the count value information 33 related to the four physical blocks, and the key information 34 related to the four physical blocks. In the process of S7, the CPU 11 specifies a physical address at which the target cluster data of the read process is stored, from the four physical block addresses stored in the SRAM 12 for example. Then, the CPU 11 reads the target cluster data of the read process out of the position indicated by the specified physical address in the NAND memory 20. The CPU 11 reads the key information 34 out of the SRAM 12, and uses the key information 34 read out of the SRAM 12 to perform inverse conversion of the randomization process on the target cluster data of the read process read out of the NAND memory 20. Then, the CPU 11 transmits the cluster data decoded by the inverse conversion to the host 2. In addition, the CPU 11 reads the count value information 33 out of the SRAM 12, and increases the read-out count value information 33 by 1. Then, the CPU 11 determines whether the target physical block of the read process is a refreshing target based on the count value information 33 obtained by addition. In a case where the target physical block of the read process is determined as the refreshing target, the CPU 11 refreshes a physical block group which shares the count value information 33 with the physical block at an arbitrary timing and resets the count value information 33.

After the process of S7, the read process on the NAND memory 20 ends.

In this way, the memory system 1 according to the embodiment divides the management information into a plurality of pieces of information, and combines a plurality of pieces of information necessary for one read operation on the NAND memory 20 out of the divided plurality of pieces of information to store the information in one area in the DRAM 30 in which addresses are consecutive. The CPU 11 reads the plurality of pieces of management information necessary for one read process on the NAND memory 20 from the DRAM 30 by one transmitting operation in the burst mode. Therefore, it is possible to reduce the number of access times compared to that in a case where the CPU 11 accesses to the DRAM 30 in the single word mode to acquire each of the plurality of pieces of management information. As a result, it is possible to improve the read performance of the memory system 1.

In addition, the CPU 11 sets the DMAC 13 with the head address information 310 indicating the head position of a transmission target area in the burst mode. With this configuration, the CPU 11 can acquire the plurality of pieces of information necessary for one read process on the NAND memory 20 through a simply process.

Further, the plurality of pieces of information to be read out by one transmitting operation may contain arbitrary kinds of information. For example, the plurality of pieces of information to be read out by one transmitting operation may be a plurality of physical block addresses necessary for one read process on the NAND memory 20. In addition, the plurality of pieces of information to be read out by one transmitting operation may include the count value information 33 indicating the number of times of the read process execution in the past. The plurality of pieces of information to be read out by one transmitting operation may include the key information 34 indicating a seed for the randomization process. In addition, the plurality of pieces of information to be read out by one transmitting operation may include arbitrary information. Further, the CPU 11 may collectively transmit two or more sets of the plurality of pieces of management information necessary for one read operation by setting the DMAC 13 with the size of a plurality of rows.

In addition, the process (S2) of converting the first logical address into the second logical address may be performed using predetermined table information. The memory system 1 may be configured to read the table entry acquired in the process of S2 and each piece of information acquired in the process of S6 out of the DRAM 30 by one transmitting operation. In this case, the head address information 310 is generated based on the first logical address.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a first memory;
    a second memory configured to store data related to a read process on the first memory; and
    a third memory configured to be accessed at a speed higher than the second memory, wherein
    the second memory is configured to be operable both in a first mode and in a second mode,
    the first mode is a burst mode in which data are transferred in units of a first size,
    the second mode is a single word mode that is different from the burst mode,
    before the read process on the first memory is performed, the data that are related to the read process on the first memory are transmitted from the second memory to the third memory in the first mode,
    a source of the transmission in the first mode is the second memory, and
    a destination of the transmission in the first mode is the third memory.

2. The memory system according to claim 1, further comprising a controller circuit, wherein the controller circuit transmits the data from the second memory to the third memory in the first mode, and performs the read process on the first memory after transmitting the data.

3. The memory system according to claim 2, further comprising a data transmission controller, wherein
    the data are stored in a memory area of the second memory in which addresses are consecutive, and
    the controller circuit designates a head address of the memory area to the data transmission controller and causes the data transmission controller to start transmission.

4. The memory system according to claim 1, wherein the read process is a process in accordance with a read request from a host, and the data are data which are used for processing the read request.

5. The memory system according to claim 1, wherein the data includes management information.

6. The memory system according to claim 5, wherein the management information includes translation information which associates a logical address with a physical address of the first memory.

7. The memory system according to claim 6, wherein the management information includes first management information and second management information which are related to different physical addresses.

8. The memory system according to claim 5, wherein the data include first management information and second management information different from the first management information; wherein
    before the read process on the first memory is performed, the first management information and the second management information are transmitted by one transmitting operation from the second memory to the third memory in the first mode.

9. The memory system according to claim 1, wherein the first memory includes a plurality of banks which are configured to be read in bank interleaving operation, and the data are transmitted from the second memory to the third memory in the first mode before the read process in the bank interleaving operation.

10. The memory system according to claim 1, wherein the data are read out from the second memory by one transmitting operation.

11. The memory system according to claim 1, wherein the data in the third memory are used for the read process.

12. A memory system comprising:
    a first memory configured to store data; and
    a second memory configured to store information related to the data stored in the first memory, wherein
    the second memory is configured to be operable both in a first mode and in a second mode,
    the first mode is a burst mode,
    the second mode is a single word mode that is different from the burst mode,
    a first portion of the information stored in the second memory are read out from the second memory in the first mode before a first read process is performed, the first portion of the information being related to the first read process, and a second portion of the information stored in the second memory are read out from the second memory in the first mode before a second read process is performed, the second portion of the information being related to the second read process.

13. The memory system according to claim 12, further comprising a controller circuit, wherein
    the controller circuit reads out the first portion of the information from the second memory in the first mode, and performs the first read process after reading out the first portion of the information,
    the controller circuit reads out the second portion of the information from the second memory in the first mode, and performs the second read process after reading out the second portion of the information.

14. The memory system according to claim 13, further comprising a data transmission controller, wherein
    the information are stored in a memory area of the second memory in which addresses are consecutive, and
    the controller circuit designates a head address of the memory area to the data transmission controller and causes the data transmission controller to start reading out a portion of the information.

15. The memory system according to claim 12, wherein the first read process is a process in accordance with a first read request from a host, the first read request is a request for reading a first portion of the data, the first portion of the information is used for processing the first read request, the second read process is a process in accordance with a second read request from the host, the second read request is a request for reading a second portion of the data, the second portion of the information is used for processing the second read request.

16. The memory system according to claim 12, wherein the information includes management information.

17. The memory system according to claim 15, wherein the management information includes translation information which associates logical addresses with physical addresses of the first memory.

18. The memory system according to claim 15, wherein each portion of the information includes first management information and second management information different from the first management information.

19. The memory system according to claim 12, wherein the first memory includes a plurality of banks which are configured to be read in a bank interleaving operation, and each portion of the information is read out from the second memory in the first mode before the corresponding read process is performed in the bank interleaving operation.

20. The memory system according to claim 12, wherein the each portion of the information is read out from the second memory by one transmitting operation.

* * * * *